(12) United States Patent
Jao et al.

(10) Patent No.: US 7,928,526 B2
(45) Date of Patent: Apr. 19, 2011

(54) IMAGING MODULE PACKAGE

(75) Inventors: Ching-Lung Jao, Taipei Hsien (TW); Yu-Te Chou, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 556 days.

(21) Appl. No.: 11/972,511

(22) Filed: Jan. 10, 2008

(65) Prior Publication Data

US 2009/0096047 A1    Apr. 16, 2009

(30) Foreign Application Priority Data

Oct. 11, 2007  (CN) .......................... 2007 1 0201999

(51) Int. Cl.
*H01L 31/0232* (2006.01)

(52) U.S. Cl. .................. 257/432; 257/434; 257/684

(58) Field of Classification Search ................ 257/432, 257/434, 684
See application file for complete search history.

(56) References Cited

U.S. PATENT DOCUMENTS 6,147,389 A * 11/2000 Stern et al. .................. 257/434
6,734,419 B1    5/2004 Glenn et al.

FOREIGN PATENT DOCUMENTS

CN    101001321 A    7/2007

* cited by examiner

*Primary Examiner* — Tan N Tran
(74) *Attorney, Agent, or Firm* — Jeffrey T. Knapp

(57) ABSTRACT

An exemplary imaging module package includes a substrate, an imaging sensor chip set on the substrate, a housing positioned on the substrate, and a lens module. The housing includes a first chamber enclosing the imaging sensor chip therein, a second chamber coaxially extending from the first chamber for receiving the lens module therein, and a shoulder between the first and second chambers. The shoulder abuts against a top surface of the imaging sensor chip.

11 Claims, 3 Drawing Sheets

IMAGING MODULE PACKAGE

BACKGROUND

1. Technical Field

The present invention relates to imaging technology and, particularly, to an imaging module package without deviation of an optical axis of a lens module from a center of a sensing area of the imaging sensor chip.

2. Description of Related Art

As shown in FIG. 3, an imaging module package 100 comprises a substrate 110, an imaging sensor chip 130, a housing 150, a cover glass plate 170, and a lens module 190. The substrate 110 has a top support surface 112, and is provided with a plurality of soldering pads 116 thereon. The soldering pads 116 are not higher than the top support surface 112. The imaging sensor chip 130 is set on the substrate 110 and surrounded by the soldering pads 116. The imaging sensor chip 130 comprises a sensing area 132 for receiving light, and a plurality of soldering pads 136 around the sensing area 132. The soldering pads 136 are electrically connected to the soldering pads 116 by a plurality of conductive wires 126, respectively. The housing 150 is fixed to the top support surface 112 of the substrate 110, and encloses the imaging sensor chip 130 and the soldering pads 116 therein. The housing 150 has aligned first and second chambers 152, 154. The cover glass plate 170 is received in the first chamber 152 to seal the imaging sensor chip 130 in the first chamber 152. The lens module 190 is received in the second chamber 154.

Unfortunately, the housing 150 is subjected to offset or tilt relative to the substrate 110, but the imaging sensor chip is static relative to the substrate 110. As a result, the lens module 190 offsets or tilts relative to the imaging sensor chip 130. Therefore, the optical axis of the lens module 190 deviates from a center of the sensing area 132 of the imaging sensor chip 130. This adversely affects imaging quality of the imaging module package.

What is needed, therefore, is an imaging module package which can prevent a deviation of an optical axis of a lens module from a center of a sensing area of the imaging sensor chip.

SUMMARY

In accordance with a present embodiment, an imaging module package includes a substrate, an imaging sensor chip set on the substrate, a housing positioned on the substrate, and a lens module. The housing includes a first chamber enclosing the imaging sensor chip therein, a second chamber coaxially extending from the first chamber for receiving the lens module therein, and a shoulder between the first and second chambers. The shoulder abuts against a top surface of the imaging sensor chip.

Other advantages and novel features will be drawn from the following detailed description of at least one preferred embodiment, when considered in conjunction with the attached drawings.

BRIEF DESCRIPTION OF THE DRAWINGS

Many aspects of the present imaging module package can be better understood with reference to the following drawings. The components in the drawings are not necessarily drawn to scale, the emphasis instead being placed upon clearly illustrating the principles of the present imaging module package. Moreover, in the drawings, like reference numerals designate corresponding parts throughout the several views.

DETAILED DESCRIPTION OF THE PREFERRED EMBODIMENTS

Embodiments of the present imaging module package will now be described in detail below and with reference to the drawings.

Figure 1:
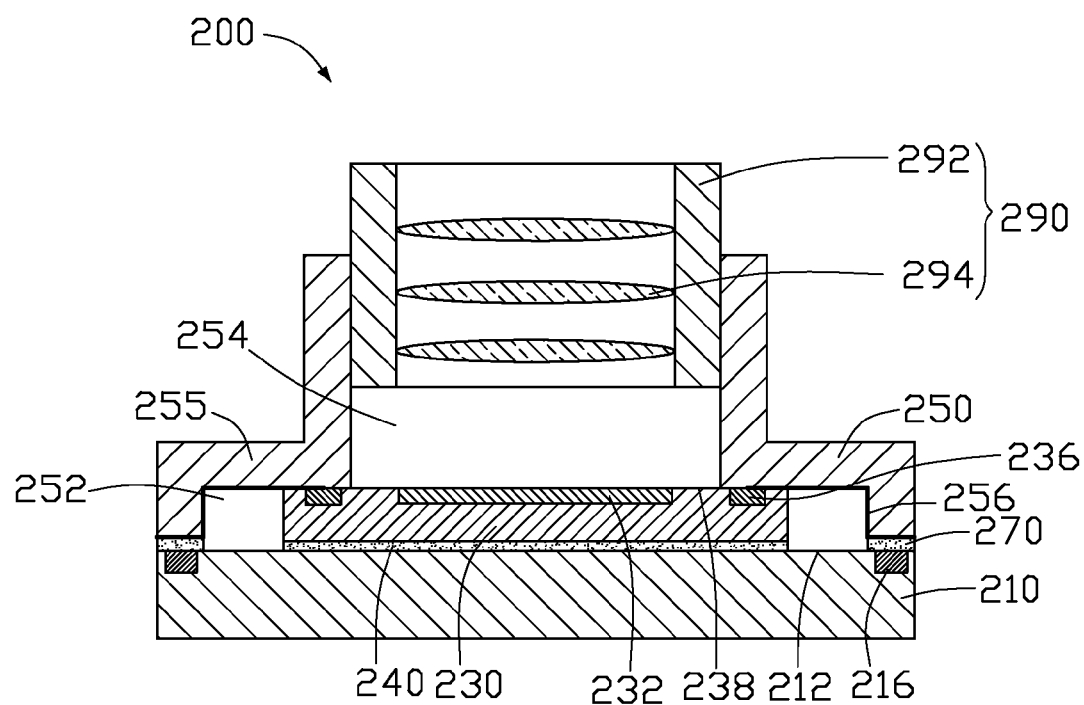
FIG. 1 is a schematic, cross-sectional view of an imaging module package, according to a present first embodiment.

Referring to FIG. 1, an imaging module package 200 in accordance with a present first embodiment is illustrated. The imaging module package 200 comprises a substrate 210, an imaging sensor chip 230, a housing 250, and a lens module 290. The imaging sensor chip 230 is set on the substrate 210 via the adhesive 240. The housing 250 is positioned on the substrate 210 and encloses the imaging sensor chip 230 therein. The lens module 290 is received at an end of the housing 250, opposing the imaging sensor chip 230.

The substrate 210 has a top support surface 212, and is provided with a plurality of soldering pads 216 thereon. The soldering pads 216 are not higher than the top support surface 212 and surround the imaging sensor chip 230.

A bonding adhesive 240 is employed between the imaging sensor chip 230 and the top support surface 212 of the substrate 210, to position the imaging sensor chip 230 to the top support surface 212. In the embodiment, the bonding adhesive 240 can be double-sided tape or the like. The imaging sensor chip 230 comprises a sensing area 232 for receiving light, a plurality of soldering pads 236 around the sensing area 232, and a top surface 238.

The housing 250 is secured to the substrate 210 by a conductive adhesive 270. The conductive adhesive 270 covers the soldering pads 216 on the substrate 210. The housing 250 comprises a first chamber 252, a second chamber 254 coaxially extending from the first chamber 252, and a shoulder 255 between the first and second chambers 252, 254. The first chamber 252 encloses the imaging sensor chip 230. The optical axis of the lens module 290 is coaxially aligned with that of the imaging sensor chip 230. The shoulder 255 abuts against a top surface 238 of the imaging sensor chip 230, and covers the soldering pads 236 on the imaging sensor chip 230. The abutment between the shoulder 255 and the top surface 238 of the imaging sensing chip 230 prevents the housing 250 from offsetting or tilting relative to the imaging sensor chip 230. As a result, the lens module 290 in the housing 250 is static relative to the imaging sensor chip 230. Therefore, the optical axis of the lens module 290 is always coaxially aligned with that of the imaging sensor chip 230, though the housing 250 offset or tilt relative to the substrate 210. Conductive traces 256 are plated on an inner surface of the first chamber 252 to electrically connect the soldering pads 236 to the soldering pads 216, respectively. The sensing area 232 of the imaging sensor chip 230 is less than an area of the second chamber 254 projected to the substrate 210. The second chamber 254 receives the lens module 290 therein.

Figure 2:
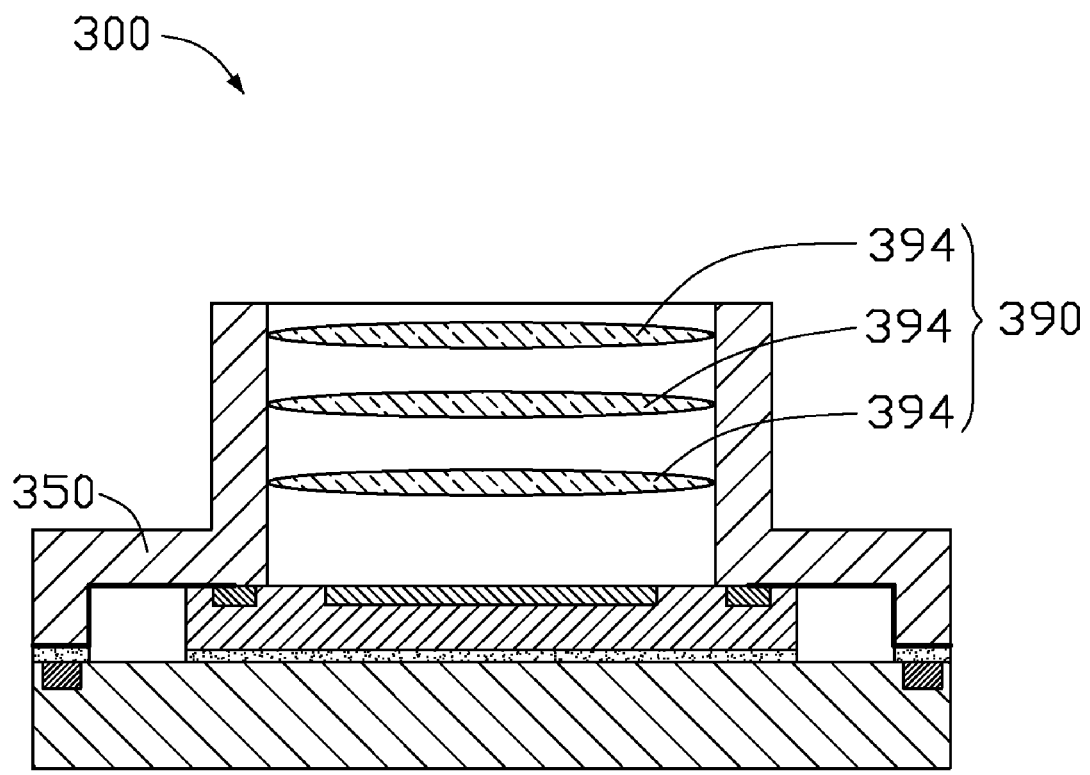
FIG. 2 is a schematic, cross-sectional view of an imaging module package, according to a present second embodiment.
Figure 3:
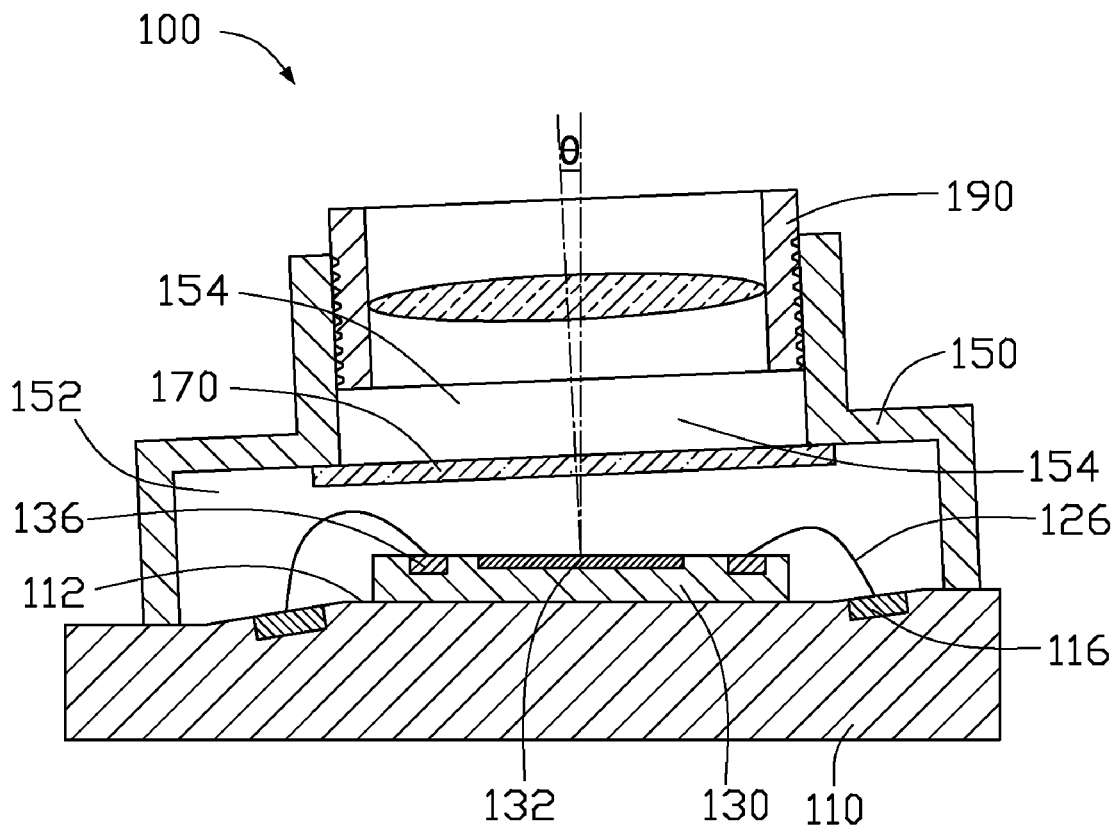
FIG. 3 is a schematic, cross-sectional view of conventional imaging module package.

In the first embodiment as shown in FIG. 1, the lens module 290 comprises a barrel 292 movably received in the second chamber 254 of the housing 250, and several lens 294 positioned into the barrel 292. In an alternative second embodiment as shown in FIG. 2, a lens module 390 of an imaging module package 300 comprises several lens 394 directly positioned into a housing 350 without a barrel. Other features of the imaging module package 300 can be referenced with the description of the imaging module package 200 of the first embodiment.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. An imaging module package, comprising:
   a substrate having a plurality of soldering pads thereon;
   an imaging sensor chip set on the substrate, the soldering pads surrounding the imaging sensor chip;
   a housing positioned on the substrate by a conductive adhesive, wherein the conductive adhesive covers the soldering pads on the substrate, the housing comprising a first chamber enclosing the imaging sensor chip therein, a second chamber coaxially being in communication with the first chamber, and a shoulder between the first and second chambers, the shoulder abutting against a top surface of the imaging sensor chip; and
   a lens module received in the second chamber.

2. The imaging module package as claimed in claim 1, wherein the imaging sensor chip is positioned to the substrate by a bonding adhesive.

3. The imaging module package as claimed in claim 1, wherein the imaging sensor chip comprises a sensing area and has a plurality of soldering pads around the sensing area, and wherein the shoulder covers the soldering pads on the imaging sensor chip.

4. The imaging module package as claimed in claim 3, wherein conductive traces are employed on an inner surface of the first chamber to electrically connect the soldering pads around the sensing area to the soldering pads on the substrate.

5. The imaging module package as claimed in claim 4, wherein the conductive traces lie on the inner surface of the first chamber.

6. The imaging module package as claimed in claim 3, wherein at least one dimension of the sensing area of the imaging sensor chip is less than at least one dimension of the second chamber projected to the substrate.

7. The imaging module package as claimed in claim 1, wherein the lens module comprises a barrel movably received in the second chamber of the housing, and several lenses positioned in the barrel.

8. An imaging module package comprising:
   a substrate having a plurality of soldering pads thereon;
   an imaging sensor chip adhered to the substrate, the soldering pads surrounding the imaging sensor chip; and
   a housing with a lens module thereon secured to the substrate by a conductive adhesive, wherein the conductive adhesive covers the soldering pads on the substrate, the housing comprising a first chamber enclosing the imaging sensor chip, a second chamber receiving the lens module, and a shoulder between the first and second chamber, the shoulder abutting against the imaging sensor chip.

9. The imaging module package as claimed in claim 8, wherein a plurality of conductive traces is formed on an inner surface of the first chamber and electrically connect the imaging sensor chip to the substrate.

10. The imaging module package as claimed in claim 9, wherein the substrate has a plurality of soldering pads surrounding the imaging sensor chip, and wherein the imaging sensor chip comprises a sensing area and has a plurality of soldering pads around the sensing area, and wherein the conductive traces electrically connect the soldering pads around the sensing area to the soldering pads on the substrate.

11. The imaging module package as claimed in claim 9, wherein the conductive traces lie on the inner surface of the first chamber.

* * * * *